United States Patent
Ji (10) Patent No.: US 11,842,766 B2
(45) Date of Patent: Dec. 12, 2023

(54) ANTI-FUSE MEMORY CIRCUIT

(71) Applicant: CHANGXIN MEMORY TECHNOLOGIES, INC., Anhui (CN)

(72) Inventor: Rumin Ji, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 150 days.

(21) Appl. No.: 17/571,577

(22) Filed: Jan. 10, 2022

(65) Prior Publication Data

US 2023/0020078 A1    Jan. 19, 2023

Related U.S. Application Data

(63) Continuation of application No. PCT/CN2021/117280, filed on Sep. 8, 2021.

(30) Foreign Application Priority Data

Jul. 19, 2021  (CN) .......................... 202110813575.5

(51) Int. Cl.
| | | |
|---|---|---|
| *G11C 17/16* | (2006.01) | |
| *G11C 11/4096* | (2006.01) | |
| *G11C 11/408* | (2006.01) | |
| *G11C 5/06* | (2006.01) | |
| *G11C 11/4074* | (2006.01) | |
| *G11C 11/4094* | (2006.01) | |

(52) U.S. Cl.
CPC .......... *G11C 11/4096* (2013.01); *G11C 5/063* (2013.01); *G11C 11/4074* (2013.01); *G11C 11/4085* (2013.01); *G11C 11/4094* (2013.01); *G11C 17/16* (2013.01)

(58) Field of Classification Search
CPC ..... G11C 17/16; G11C 5/063; G11C 11/4096; G11C 11/4074; G11C 11/4085; G11C 11/4094
See application file for complete search history.

(56) References Cited

U.S. PATENT DOCUMENTS 7,586,787 B2 * 9/2009 Vo .......................... G11C 16/10
                                                                365/185.23
9,786,383 B2 * 10/2017 Chen ...................... G11C 17/16

* cited by examiner

*Primary Examiner* — Son L Mai
(74) *Attorney, Agent, or Firm* — Cooper Legal Group, LLC (57) ABSTRACT

Provided is an anti-fuse memory circuit. The anti-fuse memory circuit includes a memory array, a bit line (BL), and a word line (WL); an anti-fuse memory cell (FsBIn) electrically connected to the bit line (BL) through a first switch transistor (1Add); a second switch transistor (2Add) configured to connect the bit line (BL) to a transmission wire (100); a third switch transistor (3Add) configured to discharge the transmission wire (100); a reading module (102) including a first input end (+) connected to the transmission wire (100), a second input end (−) for receiving a reference voltage (VTRIP), and a sampling input end (C) for receiving a sampling signal (CLK); and a compensation module (101), connected to the third switch transistor (3Add) and configured to slow down a drop speed of a voltage at the transmission wire (100).

17 Claims, 4 Drawing Sheets

ANTI-FUSE MEMORY CIRCUIT

CROSS-REFERENCE TO RELATED APPLICATIONS

This is a continuation of International Patent Application No. PCT/CN2021/117280, filed on Sep. 8, 2021, which claims priority to Chinese Patent Application No. 202110813575.5, filed on Jul. 19, 2021. The disclosures of International Patent Application No. PCT/CN2021/117280 and Chinese Patent Application No. 202110813575.5 are hereby incorporated by reference in their entireties.

TECHNICAL FIELD

The present disclosure relates to the field of design of semiconductor circuits, and particularly relates to an anti-fuse memory circuit.

BACKGROUND

An anti-fuse memory can be realized by means of an anti-fuse memory cell array. A gate oxide medium of an anti-fuse memory cell will be broken down after a high voltage is applied, and the impedance of a path after the breakdown will decrease. By detecting a resistance state of the path after the breakdown, information stored by the anti-fuse memory cell can be read.

At a data programming stage of the anti-fuse memory, a discharge transistor that discharges a transmission wire needs to perform quick discharge. Therefore, the discharge transistor is usually designed as a large-sized transistor.

However, at a data reading stage of the anti-fuse memory, although the discharge transistor will be turned off, there will still be leakage current due to the large size of the discharge transistor, that is, the discharge transistor will still discharge the transmission wire. When the anti-fuse memory cell is not programmed, a voltage at the transmission wire may possibly be read by mistake due to the discharge of the discharge transistor.

SUMMARY

Embodiments of the present disclosure provide an anti-fuse memory circuit, including a memory array, a bit line, a word line, a second switch transistor, a third switch transistor, a reading module, and a compensation module. The memory array includes a plurality of anti-fuse memory cells. The anti-fuse memory cell represents stored 1 bit data based on whether a gate oxide layer is broken down. The bit line is connected to the anti-fuse memory cells arranged in an extending direction of the bit line. The anti-fuse memory cell is electrically connected to the bit line through a first switch transistor. The word line is connected to the first switch transistors arranged in an extending direction of the word line and is configured to turn on the selected first switch transistor according to a row gating signal, and the extending direction of the bit line and the extending direction of the word line are perpendicular to each other. The second switch transistor is configured to connect the bit line to a transmission wire. The third switch transistor is configured to discharge the transmission wire. The reading module includes a first input end, a second input end, and a sampling input end, where the first input end is connected to the transmission wire, the second input end is used to receive a reference voltage, and the sampling input end is used to receive a sampling signal. The compensation module is connected to the third switch transistor and is configured to slow down voltage drop of the transmission wire caused by leakage of the third switch transistor. When the sampling signal is a valid pulse, the reading module compares an input voltage of the first input end with the reference voltage, so as to output the 1 bit data stored in the anti-fuse memory cell.

DETAILED DESCRIPTION

An anti-fuse memory is realized by means of an anti-fuse memory cell array that includes a plurality of anti-fuse memory cells. A gate oxide medium of an anti-fuse memory cell may be broken down after a high voltage is applied, and the impedance of a path after the breakdown may decrease. Therefore, by detecting a resistance state of the path after the breakdown, information stored by the anti-fuse memory cell can be read.

Specifically, at a data reading stage, after the anti-fuse memory cell is broken down, the impedance of the path decreases. After the anti-fuse memory cell(s) is activated by a bit line and a word line, charges in a transmission line after being precharged can be quickly discharged so that data readout is at a low level. In addition, when the anti-fuse memory cell(s) is not broken down, the impedance of the path is extremely large. After this anti-fuse memory cell is activated by the bit line and the word line, the discharge speed of the charges is low after pre-charging the transmission line, so that the data readout is at a high level.

Therefore, when the anti-fuse memory is subjected to data programming, the anti-fuse memory cell(s) that is broken down due to applying of a high voltage is represented as stored data "0", and the anti-fuse memory cell(s) to which high voltage is not applied is represented as stored data "1".

However, at a data programming stage of the anti-fuse memory, a discharge transistor that discharges a transmission wire needs to perform quick discharge. Therefore, the discharge transistor is usually designed as a large-sized transistor. At a data reading state of the anti-fuse memory, although the discharge transistor will be turned off, there will still be leakage current due to the large size of the discharge transistor, that is, the discharge transistor will still discharge the transmission wire, so that the anti-fuse memory cell is not broken down, and the impedance of the path is maximum. After this anti-fuse memory cell is activated by the bit line and the word line, the discharge speed of the charges in the transmission wire after being pre-charged is low, but a leakage current of the discharge transistor also discharges the transmission wire, which causes that data originally read as a high level is read out as a low level, and thus the anti-fuse memory cell is recognized as a broken-down anti-fuse memory cell, which causes a readout error of the anti-fuse memory.

Figure 1:
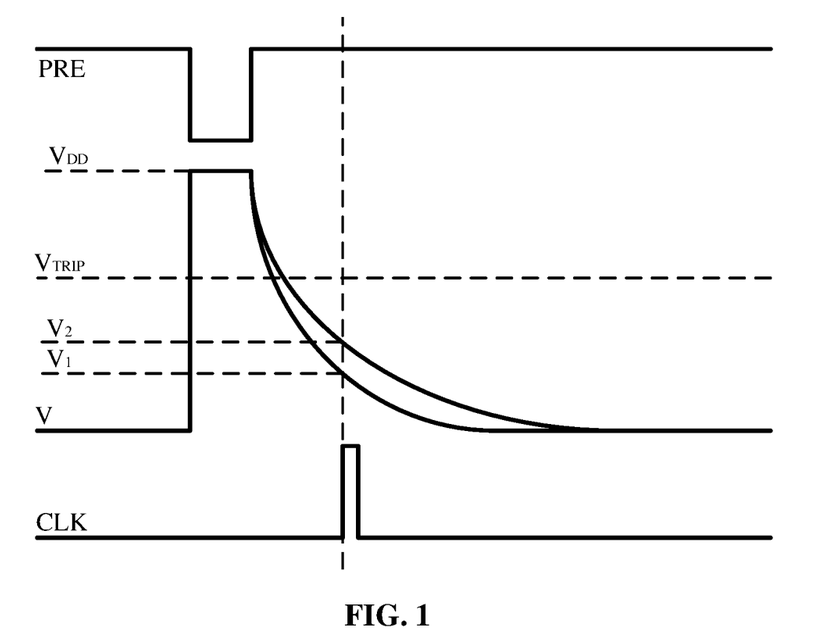
FIG. 1 is a schematic diagram of voltage versus time of an unimproved anti-fuse memory cell at a data reading stage.

Referring to FIG. 1, for a programmed anti-fuse memory cell, its equivalent resistance is low. A voltage at the transmission wire after being precharged quickly discharges through the turned-on anti-fuse memory cell. When a sampling signal CLK is at a valid level, an input voltage at the transmission wire is reduced to V1, and V1 is smaller than a reference voltage VTRIP. For an unprogrammed anti-fuse memory cell, the equivalent resistance is high. The voltage at the precharged transmission wire should not quickly discharges through the anti-fuse memory cell, but due to the leakage of the discharge transistor, when the sampling signal CLK is at the valid level, an output voltage at the transmission wire is reduced to V2, and V2 is smaller than the reference voltage VTRIP. As a result, a readout error of the anti-fuse memory is caused.

The embodiments of the present disclosure provide an anti-fuse memory circuit, including a memory array, a bit line, a word line, a second switch transistor, a third switch transistor, a reading module, and a compensation module. The memory array includes a plurality of anti-fuse memory cells, and an anti-fuse memory cells represents the stored 1 bit data based on whether a gate oxide layer is broken down. The bit line is connected to the anti-fuse memory cell arranged in an extending direction of the bit line, and the anti-fuse memory cell is electrically connected to the bit line through a first switch transistor. The word line is connected to the first switch transistor arranged in an extending direction of the word line and is configured to turn on the selected first switch transistor according to a row gating signal, where the extending direction of the bit line and the extending direction of the word line are perpendicular to each other. The second switch transistor is configured to enable the bit line to be connected to a transmission wire. The third switch transistor is configured to discharge the transmission wire. The reading module includes a first input end, a second input end, and a sampling input end. The first input end is connected to the transmission wire. The second input end is used to receive a reference voltage. The sampling input end is used to receive a sampling signal. The compensation module is connected to the third switch transistor and is configured to slow down the drop speed of a voltage at the transmission wire caused by leakage of the third switch transistor. When the sampling signal is a valid pulse, the reading module compares an input voltage at the first input end with the reference voltage, so as to output the 1 bit data stored in the anti-fuse memory cell.

Those of ordinary skill in the art can understand that in various embodiments of the present disclosure, many technical details are presented in order to make the present disclosure to be better understood by readers. However, the technical solutions claimed in the present disclosure can also be implemented without these technical details and based on various changes and modifications of the embodiments below.

Figure 2:
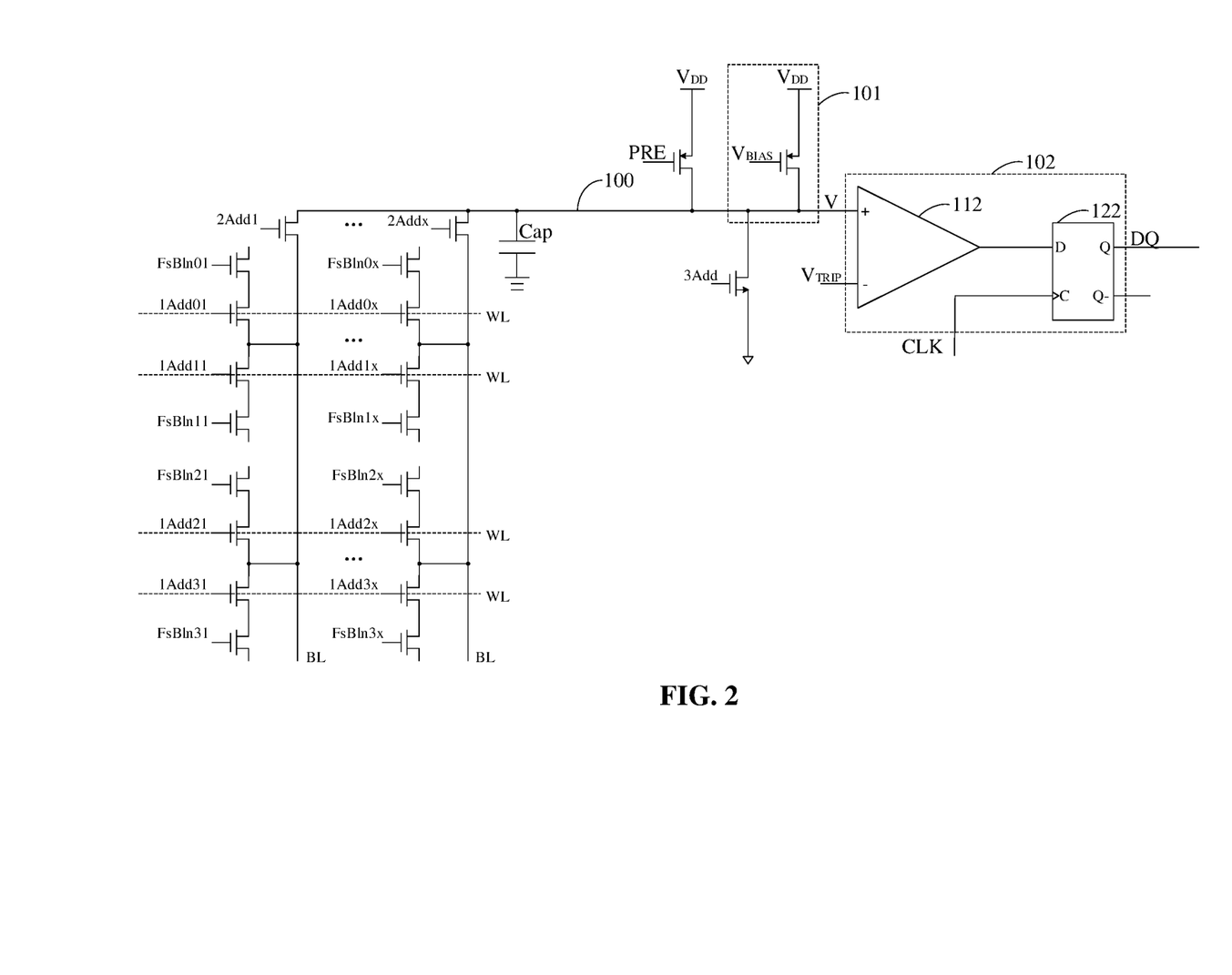
FIG. 2 is a schematic diagram of an anti-fuse memory circuit provided by some embodiments of the present disclosure.
Figure 3:
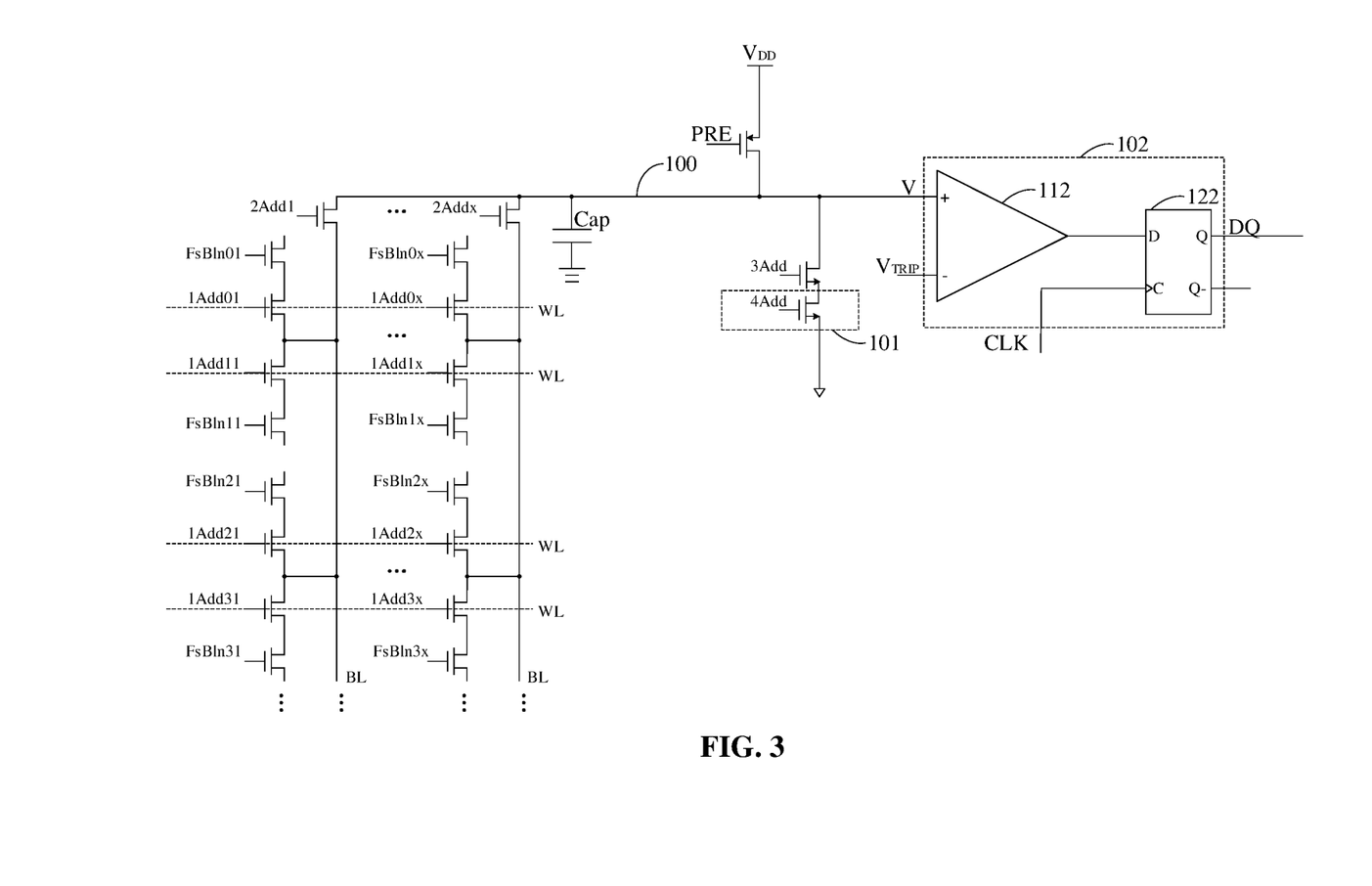
FIG. 3 is a schematic diagram of another anti-fuse memory circuit provided by some embodiments of the present disclosure.
Figure 4:
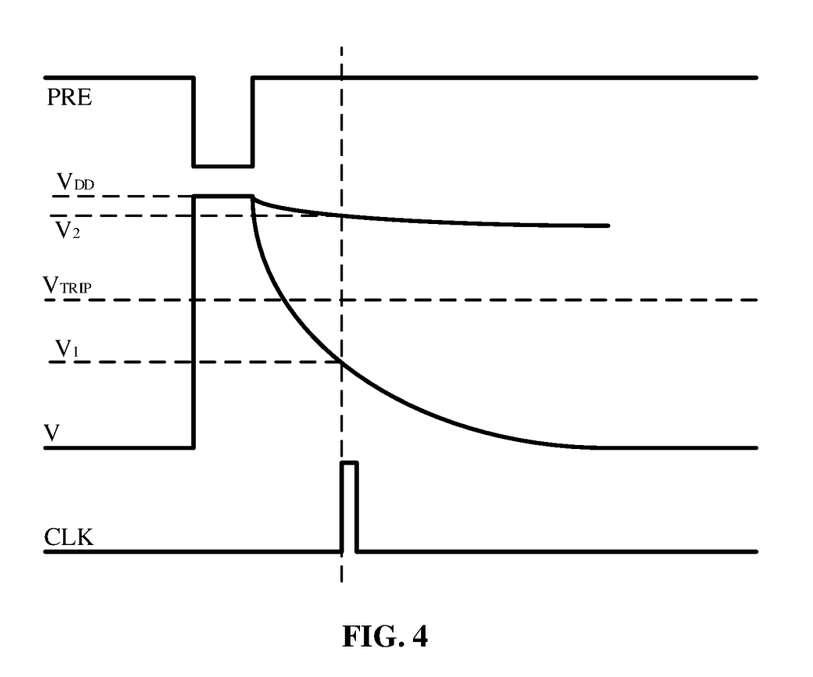
FIG. 4 is a schematic diagram of voltage versus time of an improved anti-fuse memory cell at a data reading stage according to some embodiments of the present disclosure.

FIG. 2 is a schematic diagram of an anti-fuse memory circuit provided by some embodiments. FIG. 3 is a schematic diagram of another anti-fuse memory circuit provided by some embodiments. FIG. 4 is a schematic diagram of voltage versus time of an improved anti-fuse memory cell at a data reading stage according to some embodiments. The anti-fuse memory circuit provided by some embodiments is further described in detail below in combination with the accompanying drawings, specifically as follows.

It should be noted that the "source" or "drain" in the following embodiments is only used to distinguish ports of a metal-oxide-semiconductor (MOS) and is not limited in any way. That is, the concepts of the source and the drain may be interchanged.

Referring to FIG. 2, the anti-fuse memory circuit includes: a memory array, a bit line BL, a word line WL, a second switch transistor 2Add, a third switch transistor 3Add, a reading module 102, and a compensation module 101.

The memory array includes a plurality of anti-fuse memory cells FsBln01 . . . FsBln0$x$, FsBln11 . . . FsBln1$x$, FsBln21 . . . FsBln2$x$, FsBln31 . . . FsBln3$x$. The anti-fuse memory cell represents stored 1 bit data based on whether a gate oxide layer is broken down.

It should be noted that taking an anti-fuse memory cell represented by "FsBln01" as an example, "0" represents that the anti-fuse memory cell is connected to a 0-th word line, and "1" represents that the anti-fuse memory cell is connected to a first bit line. Taking an anti-fuse memory cell represented by "FsBln2$x$" as an example, "2" represents that the anti-fuse memory cell is connected to a second word line, and "$x$" represents that the anti-fuse memory cell is connected to an x-th bit line. In addition, in the presentations of some embodiments, if there is no digital tail number behind the reference sign FsBln, it does not particularly refer to a certain anti-fuse memory cell.

The bit line BL is connected to the anti-fuse memory cell FsBln arranged in an extending direction of the bit line BL. The anti-fuse memory cell FsBln is connected to the bit line BL through a first switch transistor 1Add. Specifically, the first switch transistor 1Add includes 1Add01 . . . 1Add0$x$, 1Add11 . . . 1Add1$x$, 1Add21 . . . 1Add2$x$, 1Add31 . . . 1Add3$x$.

It should be noted that taking a first switch transistor represented by "1Add01 as an example, "01" represents that the first switch transistor is connected to the anti-fuse memory cell "FsBln01", that is, the first switch transistor 1Add01 is used as a switch transistor of the anti-fuse memory cell FsBln01. Taking a first switch transistor represented by "1Add2$x$" as an example, "2$x$" represents that the first switch transistor is connected to the anti-fuse memory cell "FsBln2$x$", that is, the first switch transistor 1Add2$x$ is used as a switch transistor of the anti-fuse memory cell FsBln2$x$. In addition, in the presentations of some embodiments, if there is no digital tail number behind the reference sign 1Add, it does not particularly refer to a certain first switch transistor.

The word line WL is connected to a first switch transistor 1Add arranged in an extending direction of the word line WL, and configured to turn on the selected first switch transistor 1Add according to a row gating signal. The extending direction of the bit line BL is perpendicular to the extending direction of the word line WL. It should be noted that the row gating signal is a word line gating signal and used to select one target word line WL among the multiple word lines WL and turn on the first switch transistor 1Add connected to the target word line WL.

Specifically, a gate of the first switch transistor 1Add is connected to the word line WL. One of a source and a drain of the first switch transistor is connected to the anti-fuse memory cell FsBln, and the other one of the source and the drain is connected to the bit line BL.

In some embodiments, in the extending direction of the bit line BL, every two adjacent first switch transistors 1Add are connected to the bit line BL through the same conductor wire. Every two adjacent first switch transistors 1Add are connected to the bit line BL through the same conductor wire, so that every two adjacent first switch transistors 1Add may share the source or drain during structural design, thereby reducing a layout area of the anti-fuse memory array, or integrating more anti-fuse memory cells under the same area.

The second switch transistor 2Add is configured to connect the bit line BL to a transmission wire 100.

A gate of the second switch transistor 2Add is used to receive a column gating signal. One of a source and a drain of the second switch transistor 2Add is connected to the bit line BL, and the other one of the source and the drain is connected to the transmission wire 100. The column gating signal is used to selectively turn on the bit line BL connected to the selected second switch transistor 2Add. It should be noted that the column gating signal is a bit line gating signal and used to select one target bit line BL among the multiple bit lines BL and turn on the second switch transistor 2Add connected to the target bit line BL.

Specifically, the second switch transistor 2Add includes 2Add1 . . . 2Addx.

The second switch transistor represented by "2Add1" is taken as an example, where "1" represents that the second switch transistor is connected to the first bit line. The first bit line is connected to the anti-fuse memory cell "FsBInz1" through the first switch transistor "1Addz1", where z is any integer from 0 to x. The second switch transistor represented by "2Addx" is taken as an example, where "x" represents that the second switch transistor is connected to the x-th bit line. The x-th bit line is connected to the anti-fuse memory cell "FsBInzx" through the first switch transistor "1Addzx", where z is any integer from 0 to x. In addition, in the presentations of some embodiments, if there is no digital tail number behind the reference sign 2Add, it does not particularly refer to a certain second switch transistor.

The third switch transistor 3Add is configured to discharge the transmission wire 100.

A gate of the third switch transistor 3Add is used to receive a discharge signal. One of a source and a drain of the third switch transistor 3Add is connected to the transmission wire 100, and the other one of the source and the drain is grounded. The discharge signal is used to turn on the third switch transistor 3Add, so as to discharge charges in the transmission wire 100.

The reading module 102 includes a first input end +, a second input end −, and a sampling input end C. The first input end + is connected to the transmission wire 100. The second input end − is used to receive a reference voltage VTRIP. The sampling input end C is used to receive a sampling signal CLK.

The compensation module 101 is connected to the third switch transistor 3Add and configured to slow down a drop speed of the voltage at the transmission wire 100 caused by leakage of the third switch transistor.

In some embodiments, the anti-fuse memory circuit further includes a precharge MOS transistor. One of a source and a drain of the precharge MOS transistor is used to receive a precharge voltage, and the other one of the source and the drain is connected to the transmission wire 100. A gate of the precharge MOS transistor is used to receive a precharge signal PRE. The precharge MOS transistor is configured to precharge the transmission wire 100 to a precharge voltage according to the precharge signal PRE. In some embodiments, the precharge voltage is an internal power voltage VDD.

When the sampling signal CLK is a valid pulse, the reading module 102 compares an input voltage V at the first input end + with the reference voltage VTRIP, so as to output 1 bit data stored in the selected anti-fuse memory cell.

The operating principle of the anti-fuse memory circuit is described in detail below by taking the anti-fuse memory cells FsBIn01 and FsBIn11 as an example, specifically as follows.

At a data programming stage, a high voltage is applied to the anti-fuse memory cell FsBIn01 so that a gate oxide medium of the anti-fuse memory cell FsBIn01 is broken down, and a low voltage or no voltage is applied to the anti-fuse memory cell FsBIn11 so that a gate oxide medium of the anti-fuse memory cell FsBIn11 is not broken down.

Specifically, in the process of applying the high voltage to the anti-fuse memory cell FsBIn01, the first switch transistor 1Add01, the second switch transistor 2Add1, and the third switch transistor 3Add are turned on. The charges in the transmission wire 100 are discharged by the third switch transistor 3Add, so as to ensure the accuracy of data programming of the anti-fuse memory cell FsBIn01.

The reading module 102 includes a comparator 112 including a first input end +, a second input end −, and an output end; and a latch device 122 including a sampling input end C and a data input end D. The data input end D is connected to the output end of the comparator. The comparator 112 is configured to compare the input voltage V at the first input end + with the reference voltage VTRIP. The latch device 122 is configured to output the 1 bit data stored in the anti-fuse memory cell.

At a data reading stage, the third switch transistor 3Add is turned off. The precharge MOS transistor receives the precharge signal PRE to conduct its source and drain. At this time, the transmission wire 100 is connected to the precharge voltage, so as to be precharged to the precharge voltage. Although the third switch transistor 3Add is turned off, there will still be a leakage current since the size of the third switch transistor 3Add is relatively large. That is, the third switch transistor 3Add will still discharge the transmission wire. In order to reduce the discharge influence of the third switch transistor 3Add, the voltage at the transmission wire 100 is compensated through the compensation module 101.

In one example, referring to FIG. 2, the compensation module 101 includes: a control unit, configured to generate a regulation signal VBIAS based on a temperature of the third switch transistor 3Add; and a charge MOS transistor, where one of a source and a drain of the charge MOS transistor is used to receive the internal power voltage VDD and the other one of the source and the drain is connected to the transmission wire 100, and a gate of the charge MOS transistor is used to receive a regulation signal VBIAS. The regulation signal VBIAS is configured to: increase the charge speed of the charge MOS transistor when the temperature of the third switch transistor increases; decrease the charge speed of the charge MOS transistor when the temperature of the third switch transistor decreases. The reason is that the current leakage capacity of the third switch transistor 3Add is in positive correlation to the temperature. If the temperature of the third switch transistor 3Add is higher, the current leakage capacity is higher; if the temperature of the third switch transistor 3Add is lower, the current leakage capacity is lower. Therefore, if the temperature of the third switch transistor 3Add increases, the charge speed of the charge MOS transistor needs to be increased to enhance the voltage compensation for the transmission wire 100; if the temperature of the third switch transistor 3Add decreases, the charge speed of the charge MOS transistor needs to be decreased to weaken the voltage compensation for the transmission wire 100.

Specifically, the charge MOS transistor is a PMOS. The source of the charge MOS transistor is used to receive the internal power voltage VDD, the drain of the charge MOS transistor is connected to the transmission wire 100, and the gate of the charge MOS transistor is used to receive the regulation signal VBIAS. Correspondingly, the regulation signal VBIAS is configured as follows: When the temperature of the third switch transistor 3Add increases, the voltage of the generated regulation signal VBIAS is decreased, so as to increase a turn-on current of the charge MOS transistor. For the PMOS transistor, a gate voltage is reduced to increase an opening degree of a conductive channel between the source and the drain, thereby improving the charge capacity of the charge MOS transistor, i.e., increasing the turn-on current of the charge MOS transistor. When the temperature of the third switch transistor 3Add decreases, the voltage of the generated regulation signal VBIAS is increased, so as to decrease the turn-on current of the charge MOS transistor. For the PMOS transistor, the gate voltage is increased to decrease the opening degree of the conductive channel between the source and the drain, thereby reducing the charge capacity of the charge MOS transistor, i.e., decreasing the turn-on current of the charge MOS transistor.

It should be noted that the charge MOS transistor may also be an NMOS transistor. Correspondingly, the regulation signal VBIAS is configured as follows. When the temperature of the third switch transistor 3Add increases, the voltage of the generated regulation signal VBIAS is increased. When the temperature of the third switch transistor 3Add decreases, the voltage of the generated regulation signal VBIAS is decreased.

Specifically, the control unit includes: a temperature acquisition sub-unit, configured to acquire the temperature of the third switch transistor 3Add; and a signal generation sub-unit, connected to the temperature acquisition sub-unit and configured to generate the regulation signal VBIAS according to the temperature of the third switch transistor 3Add.

In this example, the compensation module 101 charges the transmission wire 100, and thus the discharge for the transmission wire 100 caused by the leakage of the third switch transistor 3Add is compensated, so that the voltage drop of the transmission wire 100 caused by the leakage of the third switch transistor 3Add is slowed down, thereby avoiding the problem of an inaccurate readout of the anti-fuse memory caused by the leakage of the third switch transistor 3Add.

In another example, the compensation module 101 includes a fourth switch transistor 4Add arranged between the third switch transistor 3Add and the transmission wire 100, or arranged on a ground line of the third switch transistor 3Add. The compensation module 101 is configured to turn on or turn off the fourth switch transistor 4Add according to a supplementary discharge signal.

A voltage waveform of the supplementary discharge signal is the same as a waveform of a discharge signal. That is, if the discharge signal instructs the third switch transistor 3Add to be turned on, the supplementary discharge signal instructs the fourth switch transistor 4Add to be turned on. If the discharge signal instructs the third switch transistor 3Add to be turned off, the supplementary discharge signal instructs the fourth switch transistor 4Add to be turned off.

Specifically, the compensation module 101 is connected with the third switch transistor 3Add in series for discharge, and thus at the data programming stage, when the third switch transistor 3Add and the fourth switch transistor 4Add are turned on, a discharge current of the third switch transistor 3Add will not be affected. At the data reading stage, the third switch transistor 3Add and the fourth switch transistor 4Add are simultaneously turned off, so that an equivalent resistance of a branch where the third switch transistor 3Add is located is increased, which decreases the leakage current of the third switch transistor 3Add and slows down the voltage drop of the transmission wire 100 caused by the leakage of the third switch transistor 3Add, thereby avoiding the problem of an inaccurate readout of the anti-fuse memory caused by the leakage of the third switch transistor 3Add.

In one example, referring to FIG. 3, the fourth switch transistor 4Add is arranged on the ground line of the third switch transistor 3Add. That is, a drain of the fourth switch transistor 4Add is connected to the source of the third switch transistor 3Add, a source of the fourth switch transistor 4Add is grounded, and a gate of the fourth switch transistor 4Add is used to receive the supplementary discharge signal.

In another example, the fourth switch transistor 4Add is arranged between the third switch transistor 3Add and the transmission wire 100. That is, the drain of the fourth switch transistor 4Add is connected to the transmission wire 100, the source of the fourth switch transistor 4Add is connected to the drain of the third switch transistor 3Add, and the gate of the fourth switch transistor 4Add is used to receive the supplementary discharge signal.

In some embodiments, the third switch transistor 3Add and the fourth switch transistor 4Add are NMOS transistors. It should be noted that the third switch transistor 3Add and the fourth switch transistor 4Add may also adopt PMOS transistors.

Referring to FIG. 4, for an anti-fuse memory provided by some embodiments, its data reading process is as follows.

When the data stored in the anti-fuse memory cell FsBin01 is read, the gate oxide medium of the anti-fuse memory cell FsBin01 is broken down, and the impedance is extremely low. After the first switch transistor 1Add01 and the second switch transistor 2Add1 are turned on, the charges in the transmission wire 100 are discharged through the anti-fuse memory cell FsBIn01, so as to quickly pull down the input voltage V of the first input end +, resulting in the voltage input by the input voltage V at the first input end + to be less than the reference voltage VTRIP. When the received sampling signal CLK is a valid pulse, the reading module 102 at this time outputs a low level corresponding to the stored data "0".

When the data stored in the anti-fuse memory cell FsBin11 is read, the gate oxide medium of the anti-fuse memory cell FsBin11 is not broken down, and the impedance is extremely large. After the first switch transistor 1Add1*l* and the second switch transistor 2Add1 are turned on, the charges in the transmission wire 100 are discharged slowly through the anti-fuse memory cell FsBIn11, and the input voltage V at the first input end + cannot be pulled down quickly. Therefore, when the received sampling signal CLK is a valid pulse, the voltage input by the input voltage V at the first input end + is still greater than the reference voltage VTRIP. At this time, the reading module 102 outputs a high level corresponding to the stored data "1".

It should be noted that in some embodiments, the first input end is used as a positive phase input end of the comparator, and the second input end is used as a negative phase input end, which are only used to illustrate the anti-fuse memory circuit provided by the embodiments. In some other embodiments, the second input end receives the transmission wire, and the first input end receives the reference voltage. At this time, if the gate oxide medium of the anti-fuse memory cell is broken down, then in the reading process, the reading module 102 outputs the stored data "0" corresponding to the high level. If the gate oxide medium of the anti-fuse memory cell is not broken down, then in the reading process, the reading module 102 outputs the stored data "1" corresponding to the low level. In addition, in some embodiments, the latch device 122 is illustrated by taking a D flip-flop as an example, which is only used to illustrate the anti-fuse memory circuit provided by the embodiments. In some other embodiments, the latch device may also be a latch.

Continuing to refer to FIG. 2, in some embodiments, the anti-fuse memory circuit further includes a stabilizing capacitance Cap, an electrode plate on one side of which is connected to the transmission wire 100 and an electrode plate on the other side is grounded, so as to stabilize the voltage of the transmission wire 100 and prevent a voltage jump of the transmission wire 100.

At the data programming stage, the third switch transistor is configured to discharge the transmission wire, so as to ensure the accuracy of programming of the anti-fuse memory cell. At the data reading stage, the third switch transistor discharges the transmission wire due to its leakage current. Due to the buffering of the compensation module, the discharge velocity of the third switch transistor to the transmission wire is reduced. When the anti-fuse memory cell that needs to be read has been programmed, the gate oxide layer of the anti-fuse memory cell has been broken down, the equivalent resistance is low, and the discharge speed for the transmission wire is high. Due to the effect of the compensation module, the discharge speed for the transmission wire by the third switch transistor is low, which does not affect the discharging of the transmission wire by the anti-fuse memory cell. When the sampling signal is a valid pulse, the input voltage at the transmission wire connected to the first input end is less than the reference voltage. When the anti-fuse memory cell that needs to be read is not programmed, the gate oxide layer of the anti-fuse memory cell is not broken down, the equivalent resistance is high, and the discharge speed for the transmission wire is low. Due to the effect of the compensation module, the discharge speed for the transmission wire by the third switch transistor is also low, so as to ensure that when the sampling signal is a valid pulse, the input voltage at the transmission wire connected to the first input end is greater than the reference voltage, i.e., to ensure the accuracy of the read data of the anti-fuse memory.

It is worth mentioning that the units or modules involved in the above-mentioned embodiments are logical units, such as any suitable analog or digital circuit included in the anti-fuse memory circuit. In practical applications, a logical unit may be a physical unit or a part of a physical unit, or may be implemented by a combination of a plurality of physical units. In addition, in order to highlight the innovative part of the present disclosure, the above embodiments do not introduce units that are not closely related to solving the technical problems proposed by the present disclosure, but this does not indicate that there are no other units in the above embodiments.

Those of ordinary skill in the art can understand that the above-mentioned embodiments are specific embodiments for realizing the present disclosure, and in actual applications, various changes can be made in form and details without departing from the spirit and scope of the present disclosure.

The invention claimed is:

1. An anti-fuse memory circuit, comprising:
a memory array, comprising a plurality of anti-fuse memory cells, the anti-fuse memory cell representing stored 1 bit data based on whether a gate oxide layer is broken down;
a bit line, connected to the anti-fuse memory cell arranged in an extending direction of the bit line, wherein the anti-fuse memory cell is connected to the bit line through a first switch transistor;
a word line, connected to the first switch transistor arranged in an extending direction of the word line and configured to turn on a selected first switch transistor according to a row gating signal, wherein the extending direction of the word line is perpendicular to the extending direction of the bit line;
a second switch transistor, configured to connect the bit line to a transmission wire;
a third switch transistor, configured to discharge the transmission wire;
a reading module, comprising a first input end, a second input end, and a sampling input end, wherein the first input end is connected to the transmission wire, the second input end is used to receive a reference voltage, and the sampling input end is used to receive a sampling signal; and
a compensation module, connected to the third switch transistor and configured to slow down a drop speed of a voltage at the transmission wire caused by leakage of the third switch transistor;
wherein when the sampling signal is a valid pulse, the reading module compares an input voltage at the first input end with the reference voltage, to output the 1 bit data stored in the anti-fuse memory cell.

2. The anti-fuse memory circuit of claim 1, wherein the compensation module comprises:
a control unit, configured to generate a regulation signal based on a temperature of the third switch transistor; and
a charge MOS transistor, having a source, a drain and a gate, wherein one of the source and the drain is used to receive an internal power voltage and the other one of the source and the drain is connected to the transmission wire, and the gate is used to receive the regulation signal;
wherein the regulation signal is configured to: increase a charge speed of the charge MOS transistor when the temperature of the third switch transistor increases, and decrease the charge speed of the charge MOS transistor when the temperature of the third switch transistor decreases.

3. The anti-fuse memory circuit of claim 2, wherein the control unit comprises:
a temperature acquisition sub-unit, configured to acquire the temperature of the third switch transistor; and
a signal generation sub-unit, connected to the temperature acquisition sub-unit and configured to generate the regulation signal according to the temperature of the third switch transistor.

4. The anti-fuse memory circuit of claim 2, wherein the charge MOS transistor is a PMOS transistor, and wherein the source of the charge MOS transistor is used to receive the internal power voltage; the drain is connected to the transmission wire, and the gate is used to receive the regulation signal.

5. The anti-fuse memory circuit of claim 4, wherein the regulation signal is configured to:
when the temperature of the third switch transistor increases, decrease the voltage of the regulation signal to increase a conduction current of the charge MOS transistor; and
when the temperature of the third switch transistor decreases, increase the voltage of the regulation signal to decrease the conduction current of the charge MOS transistor.

6. The anti-fuse memory circuit of claim 1, wherein one of a source and a drain of the third switch transistor is connected to the transmission wire and the other one of the source and the drain is grounded, and a gate of the third switch transistor is used to receive a discharge signal; and
wherein the third switch transistor is configured to discharge charges in the transmission wire according to the discharge signal.

7. The anti-fuse memory circuit of claim 6, wherein the compensation module comprises:
a fourth switch transistor, arranged between the third switch transistor and the transmission wire, or arranged on a ground line of the third switch transistor and configured to turn on or turn off the fourth switch transistor according to a supplementary discharge signal;
wherein the supplementary discharge signal has a same voltage waveform as that of the discharge signal.

8. The anti-fuse memory circuit of claim 7, wherein a drain of the fourth switch transistor is connected to the transmission wire, a source of the fourth switch transistor is connected to the drain of the third switch transistor, and a gate of the fourth switch transistor is used to receive the supplementary discharge signal.

9. The anti-fuse memory circuit of claim 7, wherein a drain of the fourth switch transistor is connected to the source of the third switch transistor, a source of the fourth switch transistor is grounded, and a gate of the fourth switch transistor is used to receive the supplementary discharge signal.

10. The anti-fuse memory circuit of claim 7, wherein the third switch transistor and the fourth switch transistor are NMOS transistors.

11. The anti-fuse memory circuit of claim 1, wherein the reading module comprises:
a comparator, comprising a first input end, a second input end, and an output end; and
a latch, comprising a sampling input end and a data input end, wherein the data input end is connected to the output end of the comparator;
wherein the comparator is configured to compare a input voltage at the first input end with the reference voltage, and the latch device is configured to output the 1 bit data stored in the anti-fuse memory cell.

12. The anti-fuse memory circuit of claim 1, wherein a gate of the first switch transistor is connected to the word line, one of a source and a drain of the first switch transistor is connected to the anti-fuse memory cell, and the other one of the source and the drain is connected to the bit line.

13. The anti-fuse memory circuit of claim 12, wherein every two adjacent first switch transistors are connected to the bit line through a same conductor wire in the extending direction of the bit line.

14. The anti-fuse memory circuit of claim 1, wherein a gate of the second switch transistor is used to receive a column gating signal, one of the source and a drain of the second switch transistor is connected to the bit line, and the other one of the source and the drain is connected to the transmission wire, wherein the column gating signal is used to selectively turn on a bit line connected to the selected first switch transistor.

15. The anti-fuse memory circuit of claim 1, further comprising a precharge MOS transistor, wherein one of a source and a drain of the precharge MOS transistor is used to receive a precharge voltage, the other one of the source and the drain is connected to the transmission wire, and a gate of the precharge MOS transistor is used to receive the precharge signal; and wherein the precharge MOS transistor is configured to precharge the transmission wire to the precharge voltage according to the precharge signal.

16. The anti-fuse memory circuit of claim 15, wherein the precharge voltage is an internal power voltage.

17. The anti-fuse memory circuit of claim 1, further comprising a stabilizing capacitance, having an electrode plate on one side connected to the transmission wire and an electrode plate on the other side being grounded, the stabilizing capacitance being configured to stabilize the voltage at the transmission wire.

* * * * *